US012593471B2

(12) United States Patent
Wen et al.

(10) Patent No.: US 12,593,471 B2
(45) Date of Patent: Mar. 31, 2026

(54) VOLTAGE CONTRAST STRUCTURE FOR TRENCH CONNECTORS

(71) Applicant: Intel Corporation, Santa Clara, CA (US)

(72) Inventors: Xiao Wen, Beaverton, OR (US); Dipto Thakurta, Portland, OR (US); Sairam Subramanian, Portland, OR (US); Manish Sharma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 761 days.

(21) Appl. No.: 17/855,632

(22) Filed: Jun. 30, 2022

(65) Prior Publication Data

US 2024/0006501 A1     Jan. 4, 2024

(51) Int. Cl.
H10D 30/67       (2025.01)
H10D 30/62       (2025.01)
H10D 62/10       (2025.01)
H10D 64/01       (2025.01)

(52) U.S. Cl.
CPC ..... H10D 30/6735 (2025.01); H10D 30/6219 (2025.01); H10D 30/6757 (2025.01); H10D 62/121 (2025.01); H10D 64/01 (2025.01)

(58) Field of Classification Search
CPC ........... H10D 30/6735; H10D 30/6219; H10D 30/6757; H10D 62/121; H10D 64/01; H10D 30/43; H10D 30/014; H10D 84/0149; H10D 84/038; H10D 84/83; H01L 21/76895; H01L 22/14; H01L 22/34; H01L 23/481; H01L 23/535; B82Y 10/00
See application file for complete search history.

(56) References Cited

U.S. PATENT DOCUMENTS

| | | | |
|---|---|---|---|
| 10,790,271 B2 * | 9/2020 | Xu | ..................... H01L 21/76251 |
| 2007/0001219 A1 * | 1/2007 | Radosavljevic | ..... H10D 30/024 257/327 |
| 2023/0187551 A1 * | 6/2023 | Cheng | ................ H10D 30/6757 257/369 |

* cited by examiner

*Primary Examiner* — Jonathan Han
(74) *Attorney, Agent, or Firm* — Schwabe, Williamson & Wyatt P.C.

(57)         ABSTRACT

Embodiments described herein may be related to apparatuses, processes, systems, and/or techniques for electrically coupling components of a transistor structure together in order to perform a voltage contrast test to determine opens and shorts within the transistor structure. In embodiments, trench contacts (TCN) within a transistor structure may be electrically coupled together with an electrical connection that is electrically isolated from a power rail. In other embodiments, TCN may be electrically coupled using P-type epitaxial layers on a P-type substrate. Other embodiments may be described and/or claimed.

24 Claims, 10 Drawing Sheets

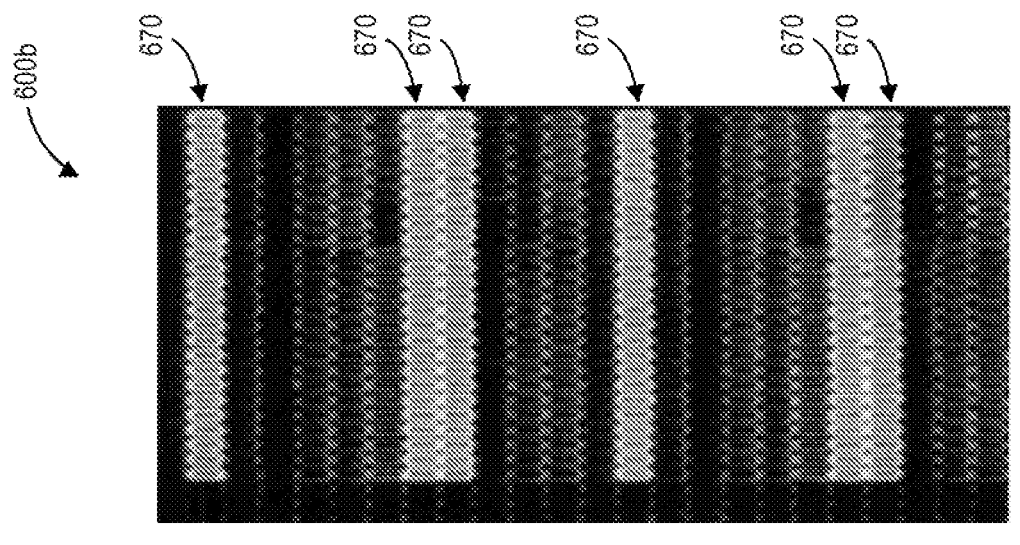
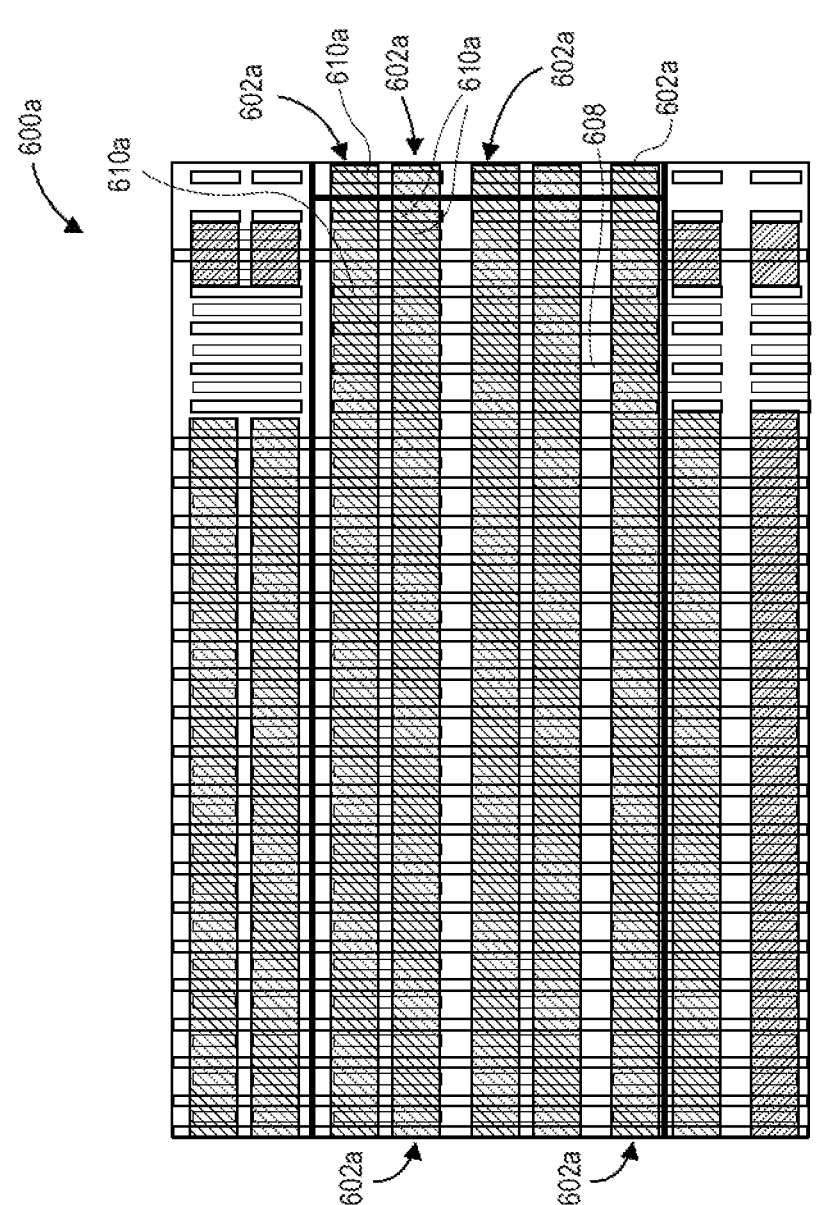
FIG. 6

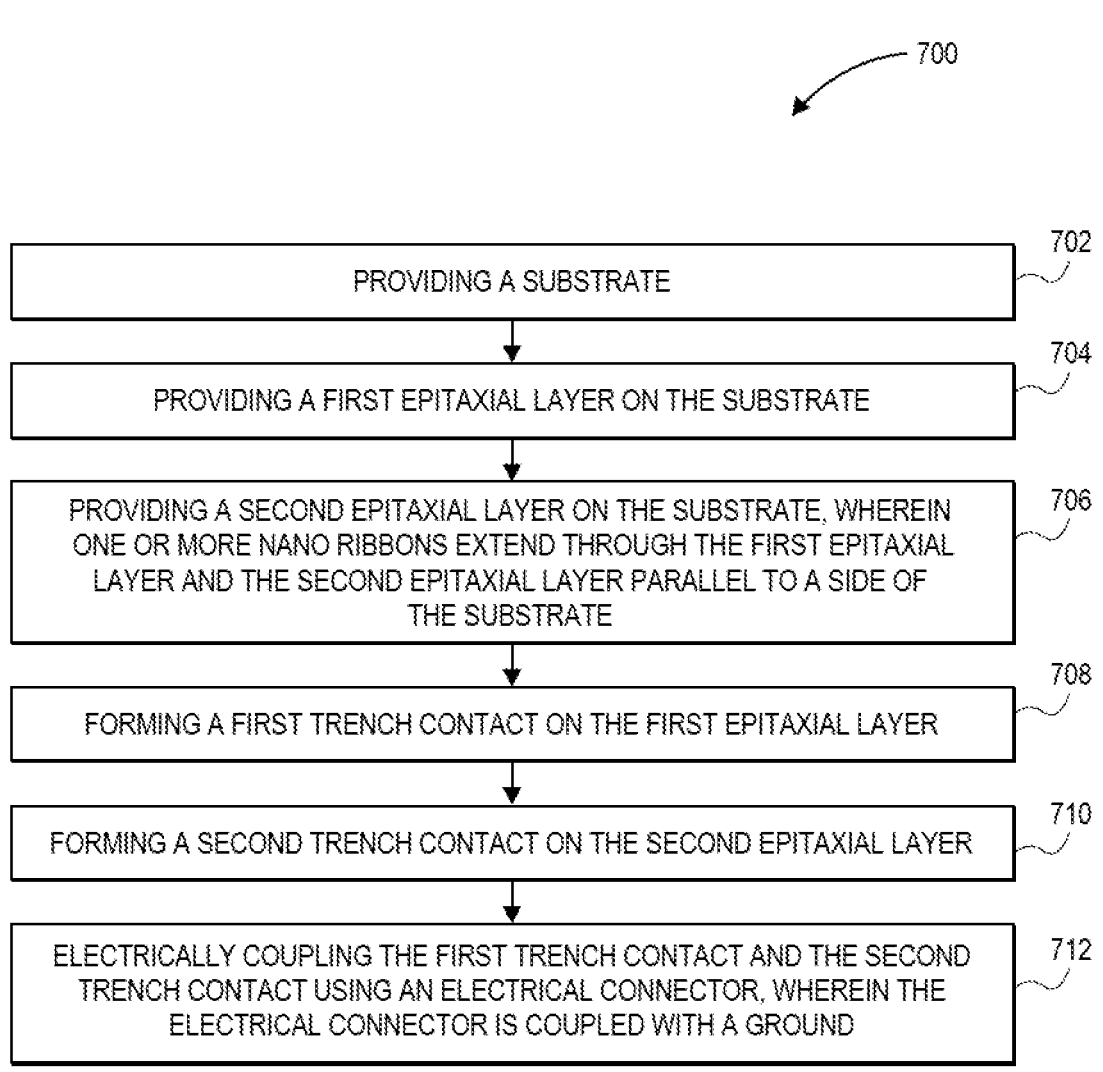

— 700

702

PROVIDING A SUBSTRATE

704

PROVIDING A FIRST EPITAXIAL LAYER ON THE SUBSTRATE

706

PROVIDING A SECOND EPITAXIAL LAYER ON THE SUBSTRATE, WHEREIN ONE OR MORE NANO RIBBONS EXTEND THROUGH THE FIRST EPITAXIAL LAYER AND THE SECOND EPITAXIAL LAYER PARALLEL TO A SIDE OF THE SUBSTRATE

708

FORMING A FIRST TRENCH CONTACT ON THE FIRST EPITAXIAL LAYER

710

FORMING A SECOND TRENCH CONTACT ON THE SECOND EPITAXIAL LAYER

712

ELECTRICALLY COUPLING THE FIRST TRENCH CONTACT AND THE SECOND TRENCH CONTACT USING AN ELECTRICAL CONNECTOR, WHEREIN THE ELECTRICAL CONNECTOR IS COUPLED WITH A GROUND

FIG. 7

VOLTAGE CONTRAST STRUCTURE FOR TRENCH CONNECTORS

FIELD

Embodiments of the present disclosure generally relate to the field of semiconductor manufacturing, and in particular to testing for defects on a wafer.

BACKGROUND

Continued growth in virtual machines, cloud computing, and portable devices will continue to increase the demand for high density transistors within chips and packages. In addition, there will be an increased need for high quality components with an improved efficiency in identifying device defects on a substrate or on a wafer.

BRIEF DESCRIPTION OF THE DRAWINGS

FIG. 6 shows a top-down view of an array of transistor structures that include P-type epitaxial structures on a P-type substrate, and a VC scan of a part of the transistor structures that show electrically shorted TCNs, in accordance with various embodiments.

FIG. 7 illustrates an example process for manufacturing a voltage contrast structure, in accordance with various embodiments.

DETAILED DESCRIPTION

Figure 1A:
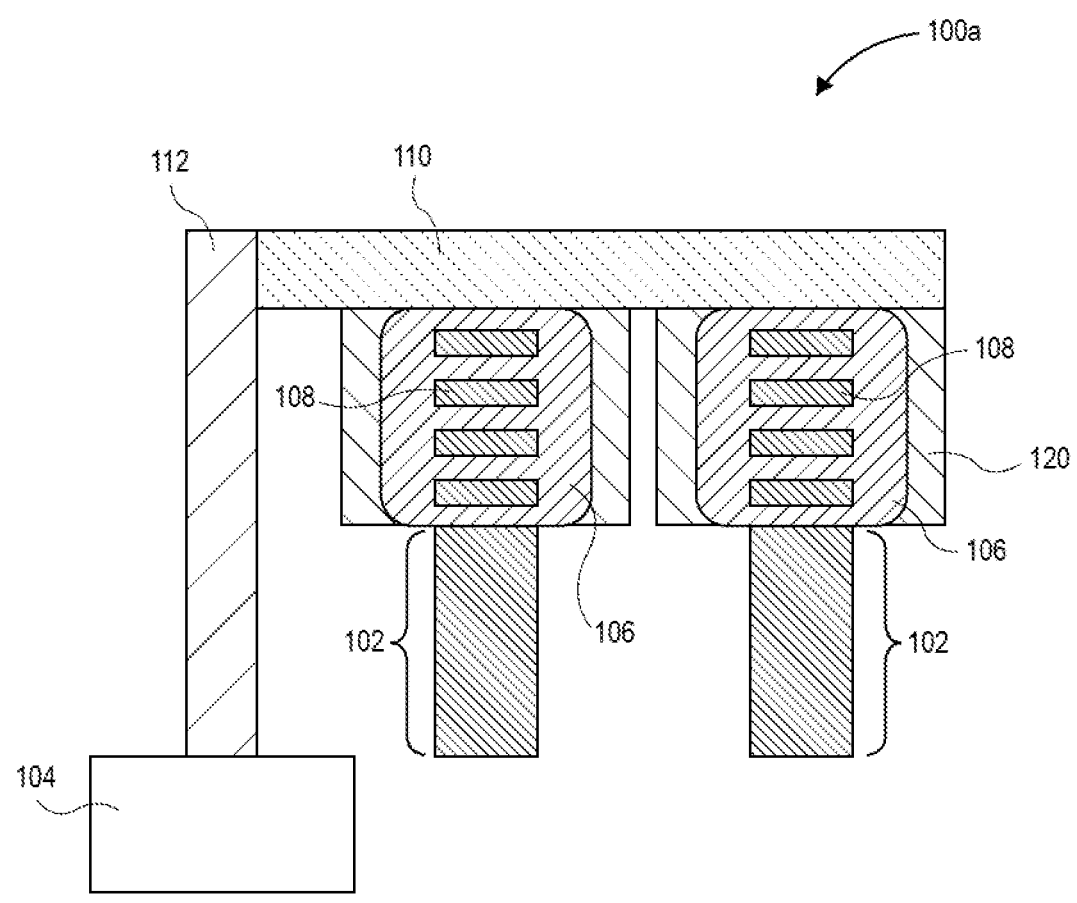
FIGS. 1A-1B show a cross-section end view and a cross section side view of a transistor structure that includes multiple epitaxial structures and multiple gates surrounding a nano ribbon, with multiple trench contacts (TCN) on the epitaxial structures, in accordance with various embodiments.

Embodiments described herein may be related to apparatuses, processes, systems, and/or techniques for creating VC structures for nano ribbon-based transistors on a substrate for defect testing. In embodiments, electrical continuity, or electrical defects, within a plurality of TCN, or other component, that are on a nano-ribbon transistor structure may be efficiently identified using a VC inspection technique. In embodiments, the nano-ribbon transistors may be on a wafer or a substrate.

VC inspection is a defect inspection technique based on scanning electron microscopy. As an e-beam scans on metal lines, it positively charges the metal in the lines. Any grounded metal lines, for example, which electrically connect to the wafer substrate, emit more electrons and presents as a brighter pattern in e-beam scan images. Any metal lines which are not grounded and which may be isolated from the substrate, which may be referred to as floating metal lines, emit less electrons and look darker in e-beam scan images.

The brightness difference among metal lines due to voltage difference (grounded versus not grounded) is called voltage contrast (VC). If the brightness pattern in a VC image deviates from design, it shows defects in the underlying structures. When a floating structure, or one not coupled with the substrate ground, turns bright, it indicates a short defect that connects the structure to a ground. If a structure that is designed to be grounded shows as dark, it indicates an open defect that is not connected to a ground. A defect is detected when a brightness pattern seen deviates from the brightness expected from the original design.

In embodiments described herein, and electrical connection, which may also be implemented as a PowerVia™ structure, may electrically couple multiple TCN in order to identify opens or shorts within TCN structures using VC inspection. In embodiments, these electrical connections may be electrically isolated from a power rail or power source on the substrate. In embodiments described herein, multiple TCN may also be electrically coupled by electrically coupling with a P-type epitaxial, which may all be electrically coupled through contact with a P-type substrate. In embodiments, an electrical coupling between a first P-type epitaxial, a P-type substrate, and a second P-type epitaxial may be referred to as a P-tap. In some embodiments, both techniques, electrical connections and P-tap, may be used in the VC test process.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1B:
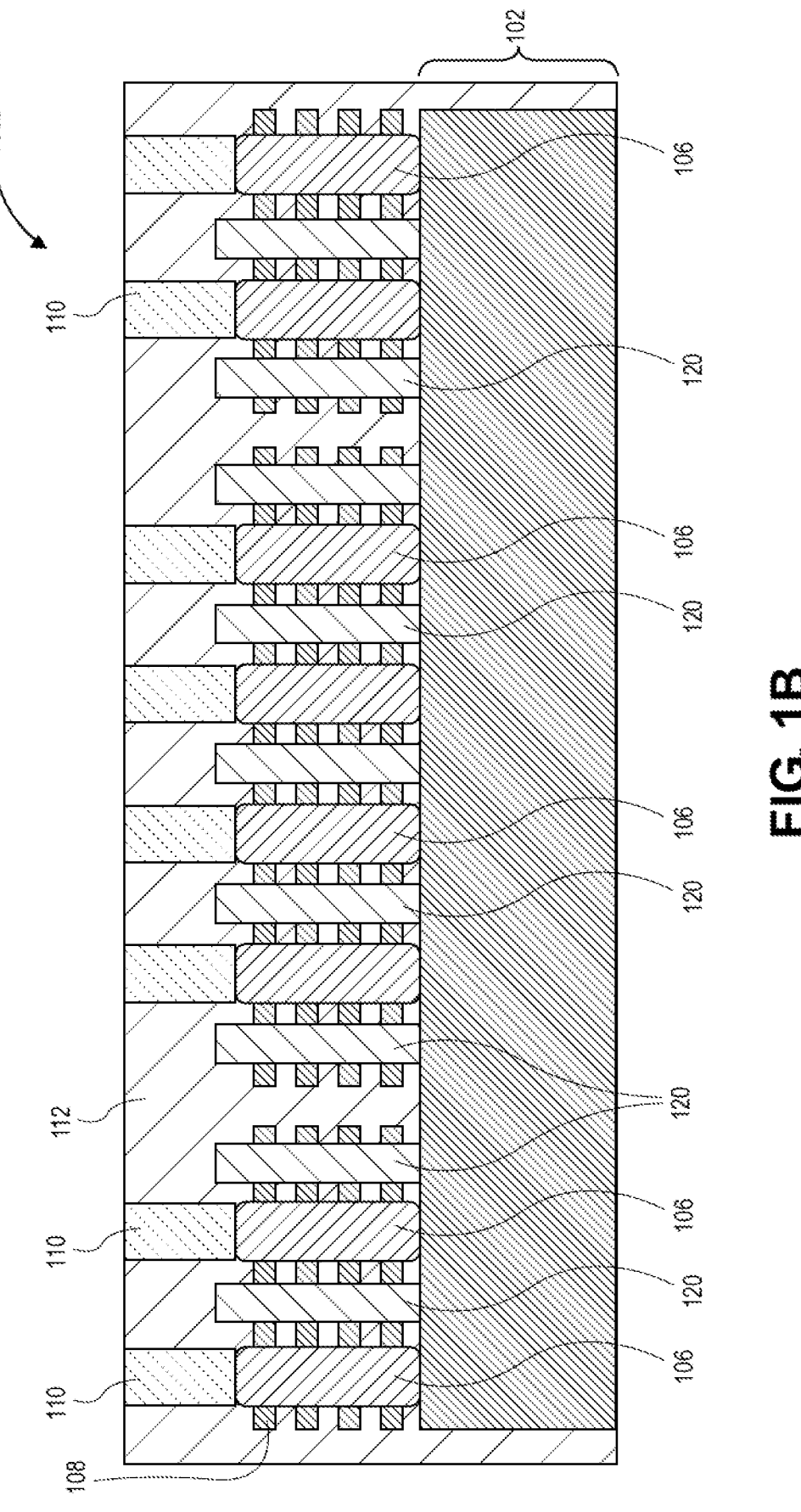

FIG. 1A-1B show a cross-section end view and a cross section side view of a transistor structure that includes multiple epitaxial structures and multiple gates surrounding a nano-ribbon, with multiple TCN on the epitaxial structures, in accordance with various embodiments. FIG. 1A shows a cross-section end view of transistor structure 100a that includes a substrate layer 102. In embodiments, there may be a metal layer 104, which may be referred to as a backside metal layer, or a BMO metal layer, underneath the substrate layer 102.

A plurality of epitaxial layers 106, which may be either epitaxial sources or epitaxial drains, may be on the substrate layer 102. In some embodiments, there may be an insulator layer (not shown) that physically separates the epitaxial layers 106 from the substrate layer 102. In embodiments, a plurality of nano-ribbons 108 may extend through the epitaxial layers 106. In embodiments, a plurality of gates 120 may surround the plurality of nano-ribbons 108, and may be positioned between some of the epitaxial layers 106.

A plurality of TCN 110 may electrically couple with one or more of the epitaxial layers 106. In embodiments, at least some of the plurality of TCN 110 may electrically couple with an electrical connector 112, which may be in electrical contact with the substrate 102, and/or the metal layer 104. In embodiments, the electrical connector 112 may provide a ground to be used during a VC scan.

It should be noted that in this configuration, absent the electrical connector 112, a direct physical or direct electrical connection is not guaranteed between the substrate 102 and the epitaxial layers 106. As a result, the grounding path for the TCN 110, without the electrical connector 112, is unreliable. In embodiments, with the introduction of the electrical connector 112, a robust grounding path is established for VC testing.

FIG. 1B shows a cross-section side view of transistor structure 100b, which may be similar to transistor structure 100a of FIG. 1A, that shows the plurality of TCN 110, that may be on, respectively, a plurality of epitaxial layers 106, each having nano-ribbons 108 through the epitaxial layers 106. In embodiments, multiple gates 120 may also have nano-ribbons 108 extending through them. In embodiments, some of the TCN 110 may be electrically coupled with the electrical connector 112.

Figure 2A:
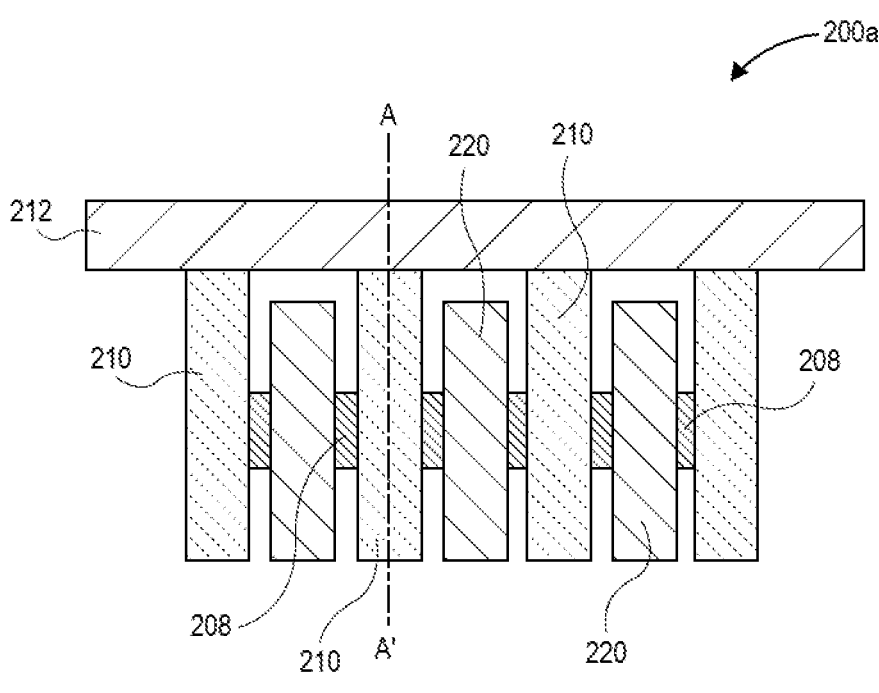
FIGS. 2A-2B show top-down views of a transistor structure with one or more electrical connectors that electrically couple a plurality of trench contacts, in accordance with various embodiments.
Figure 2B:
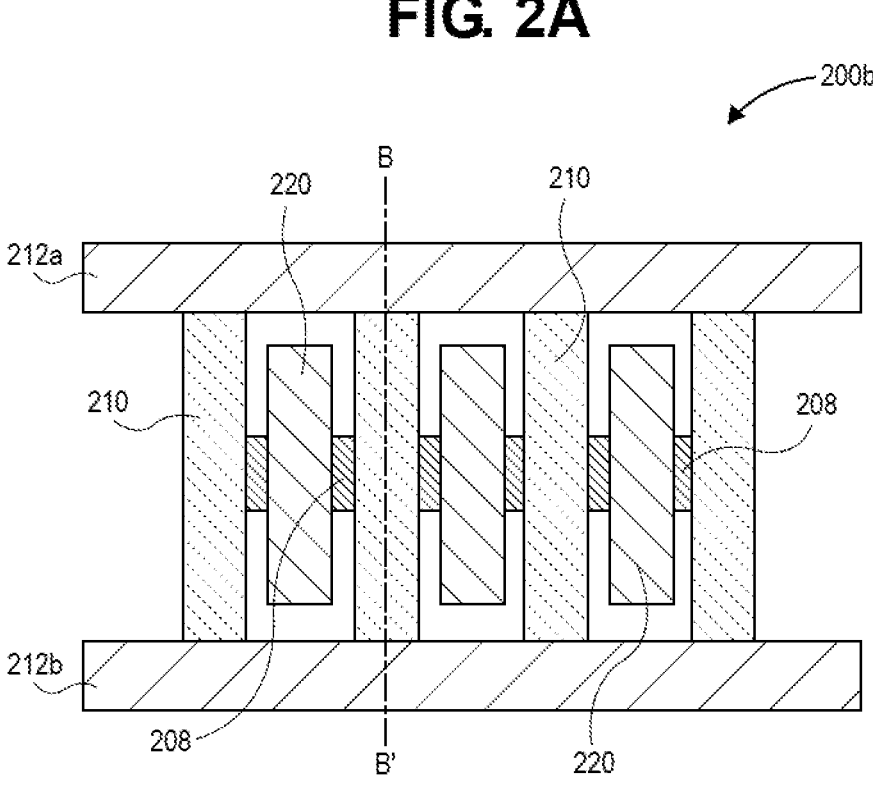

FIGS. 2A-2B show top-down views of a transistor structure with one or more electrical connectors that electrically couple a plurality of trench contacts, in accordance with various embodiments. FIG. 2A shows transistor structure 200a, which may be similar to transistor structure 100 of FIG. 1. Transistor structure 200a is a top-down view with electrical connector 212, TCN 210, gate 220, and nano-ribbons 208, which may be similar to electrical connector 112, TCN 110, gate 120, and nano-ribbons 108 of FIG. 1. As shown, the TCN 210 is directly electrically coupled with the electrical connector 212.

FIG. 2B, which may be similar to FIG. 2A, shows a transistor structure 200b that includes two electrical connectors 212a, 212b that are both electrically coupled with the TCN 210. In this embodiment, each of the TCN 210 has a redundant electrical coupling with a grounding source through the electrical connectors 212a, 212b. In embodiments, TCN 210 that are electrically coupled with the electrical connectors 212a, 212b may be referred to as grounded. TCN 210 that are not electrically coupled with the electrical connectors 212a, 212b may be considered floating. In these embodiments, as shown with respect to FIGS. 4A-4B, multiple breaks within a TCN 210 may be more readily detected when the TCN 210 is grounded.

Figure 3A:
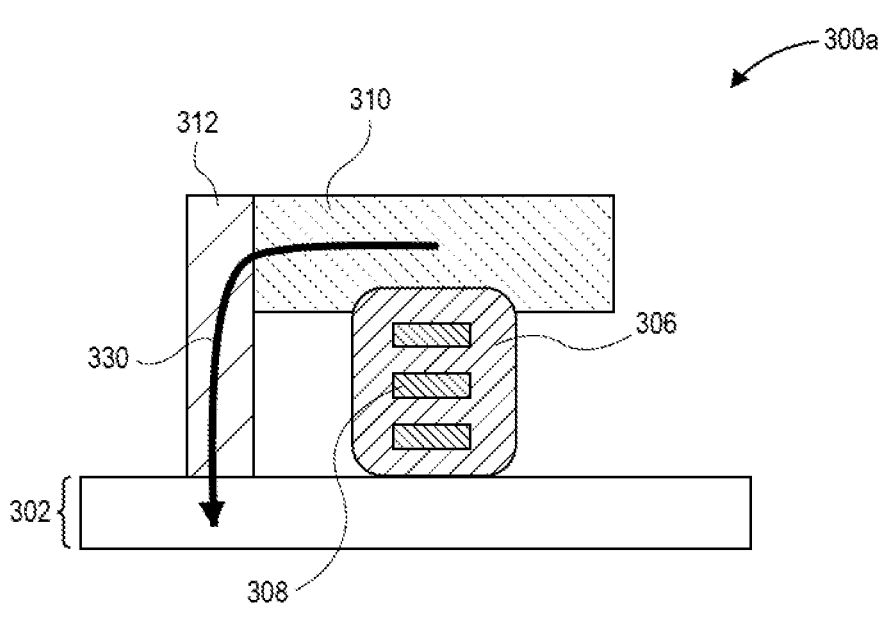
FIGS. 3A-3B show cross section views of a transistor structure with one or more electrical connectors that electrically couple a plurality of trench contacts, in accordance with various embodiments
Figure 3B:
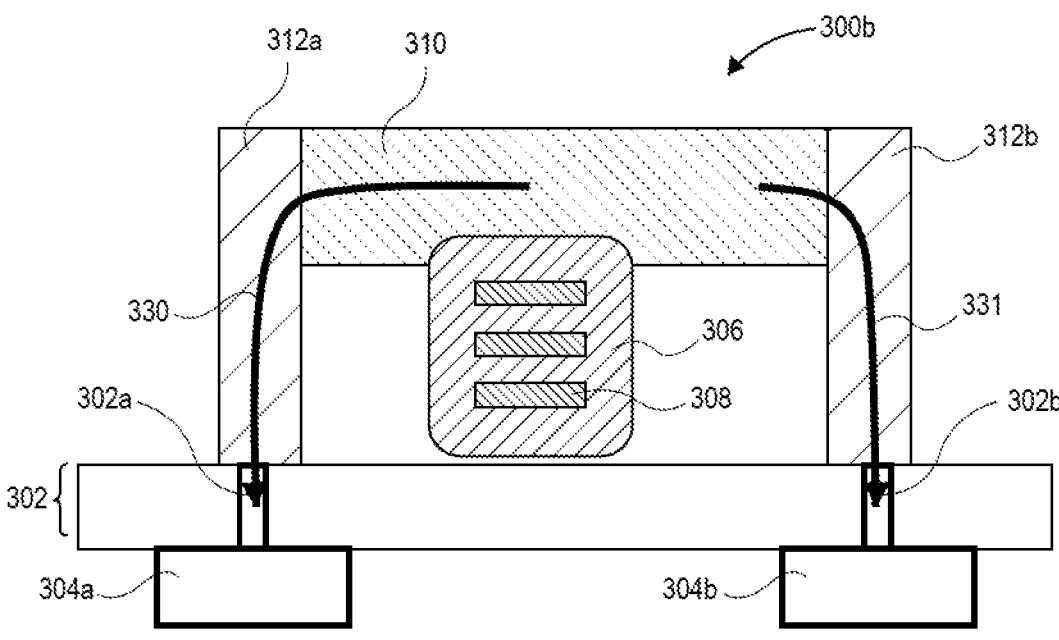

FIGS. 3A-3B show cross section views of a transistor structure with one or more electrical connectors that electrically couple a plurality of trench contacts, in accordance with various embodiments. FIG. 3A shows transistor structure 300a, which is a cross section side view of transistor structure 200a of FIG. 2A, at the A-A' cut through the TCN 210. Transistor structure 300a includes TCN 310, and electrical connector 312, which may be similar to TCN 210 and electrical connector 212 of FIG. 2A.

In embodiments, the TCN 310 is above a substrate 302, and the electrical connector 312 is physically and electrically coupled with the substrate 302. In embodiments, the substrate 302 may be a silicon substrate. An epitaxial layer 306, which may be similar to epitaxial layer 106 of FIG. 1, is located between the substrate 302 and a bottom of the TCN 310. One or more nano-ribbons 308 may be within epitaxial layer 306. As a result, the TCN 310 is electrically coupled with the substrate 302 through the electrical contact 312 along path 330, to provide a robust path for subsequent VC testing.

FIG. 3B shows transistor structure 300b, which is a cross section side view of transistor structure 200b of FIG. 2B, at the B-B' cut through the TCN 210. Transistor structure 300b includes TCN 310 and electrical connectors 312a, 312b, which may be similar to TCN 210 and electrical connectors 212a, 212b of FIG. 2B. In embodiments, the TCN 310 is above a substrate 302, and the electrical connectors 312a, 312b are physically and electrically coupled with the substrate 302. In embodiments, the substrate 302 may be a silicon substrate. An epitaxial layer 306, which may be similar to epitaxial layer 106 of FIG. 1, is located between the substrate 302 and a bottom of the TCN 310. One or more nano-ribbons 308 may be within the epitaxial layer 306. As a result, the TCN 310 is electrically coupled with the substrate 302 through the electrical connectors 312a, 312b along paths 330, 331, to provide a robust path for subsequent VC testing of the TCN 310.

In embodiments, a first metal layer routing 304a and a second metal layer routing 304b may be beneath the substrate 302. The first metal layer routing 304a may be electrically coupled with one of the electrical connectors 312a through a conductive via 302a through the substrate 302, and the second metal layer routing 304b may be electrically coupled with one of the electrical connectors 312b through a conductive via 302b through the substrate 302. In embodiments, the first metal layer routing 304a and the second metal layer routing 304b may be electrically isolated from a power rail, or may be electrically isolated from any other power source.

Figure 4:
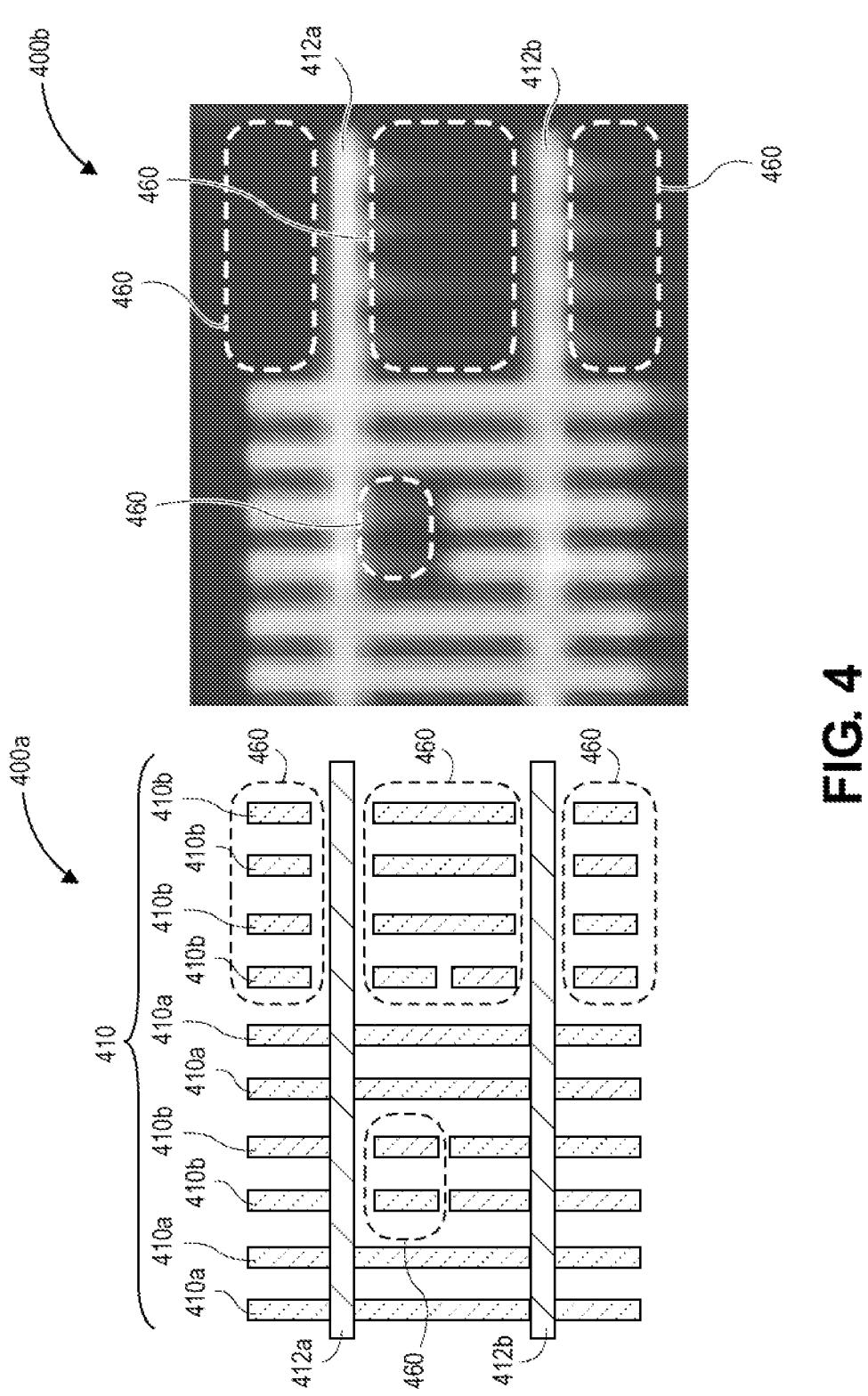
FIG. 4 shows top-down views of a transistor diagram that includes broken TCN, and a voltage contrast (VC) scan of the structure that shows areas of the broken TCN as dark, in accordance with various embodiments.

FIG. 4 shows top-down views of a transistor diagram that includes broken TCN, and a voltage contrast (VC) scan of the structure that shows areas of the broken TCN as dark, in accordance with various embodiments. Transistor structure 400a, which may be similar to transistor structure 200b of FIG. 2B, shows a top-down view that includes electrical connectors 412a, 412b, which may be similar to electrical connectors 312a, 312b of FIG. 3B.

TCN 410, which may be similar to TCN 310 of FIG. 3B, may be at least partially electrically connected with the electrical connectors 412a, 412b. In particular, TCN 410a may be fully electrically coupled with the electrical connectors 412a, 412b, while the TCN 410b may be either partially electrically coupled or fully electrically isolated from the electrical connectors 412a, 412b. As a result, portions of the TCN 410 that fall within areas 460 are not electrically coupled with the electrical connectors 412a, 412b.

Image 400b, which is a visual result of a VC scan of the transistor structure 400a, shows dark areas 460 that correspond to the area shown with respect to transistor structure 400a, because electrons during the scanning process were unable to flow to any of the areas within areas 460. Thus, the portions of the TCN 410 that are floating (not electrically connected) appear as dark. The portions of the TCN 410 that are electrically coupled with the electrical connectors 412a, 412b appear bright. Thus, the resulting brightness pattern shown in 400b may be compared to the layout design to determine whether there are any defects within the transistor structure 400a.

Figure 5:
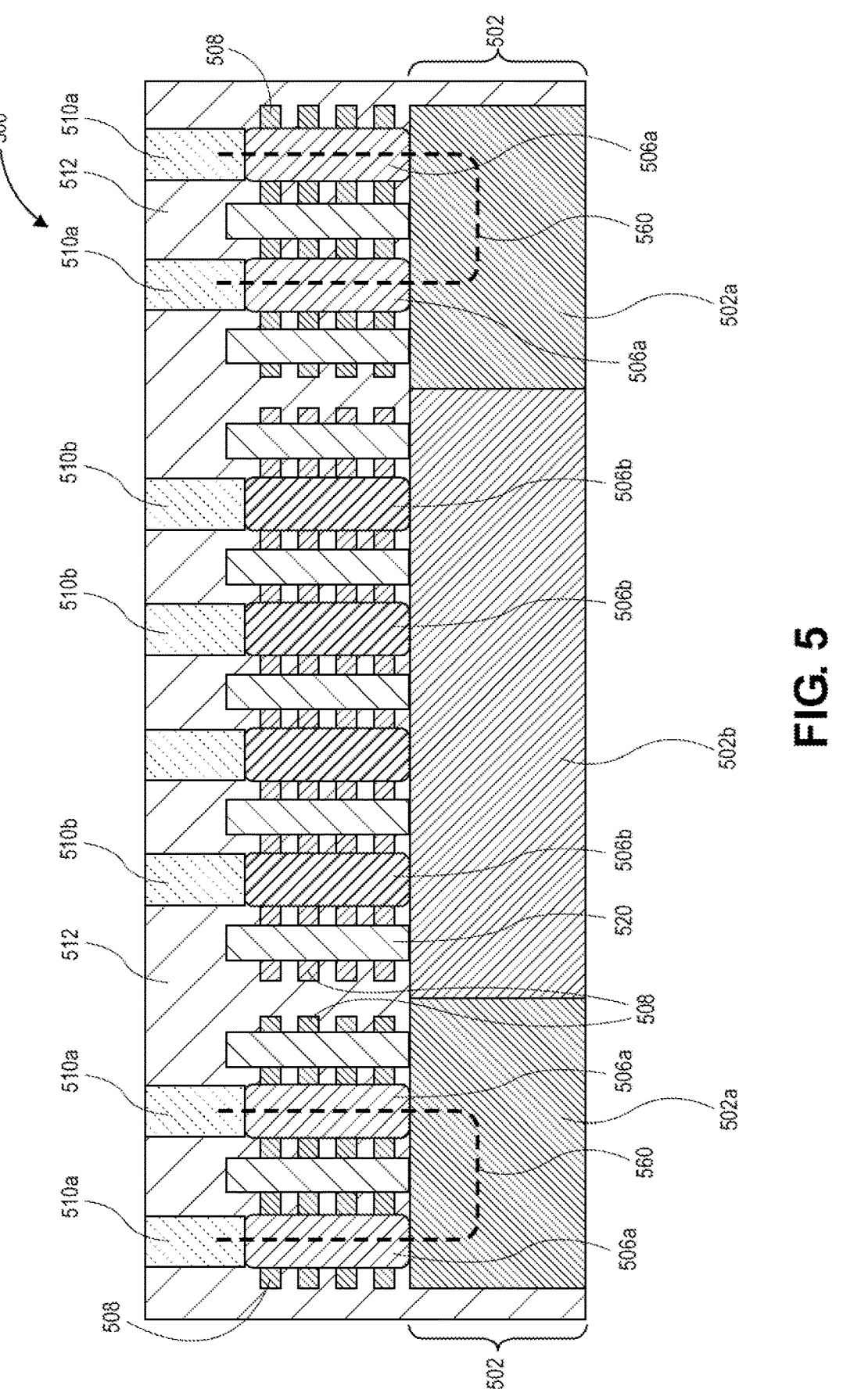
FIG. 5 shows a cross section side view of a transistor structure that includes multiple epitaxial structures and multiple gates surrounding a nano ribbon, where a portion of the substrate is a P-type substrate and some of the epitaxial structures are P-type epitaxial structures, in accordance with various embodiments.

FIG. 5 shows a cross section side view of a transistor structure that includes multiple epitaxial structures and multiple gates surrounding a nano-ribbon, where a portion of the substrate is a P-type substrate and some of the epitaxial structures are P-type epitaxial structures, in accordance with various embodiments. Transistor structure 500, which may be similar to transistor structure 100b of FIG. 1B, includes a substrate layer 502, which may be similar to substrate layer 102 of FIG. 1B. However, the substrate layer 502 is divided into a P-type regions 502a, and an N-type region 502b.

A plurality of P-type epitaxial layers 506a, which may be either epitaxial sources or epitaxial drains, may be on the P-type regions 502a of the substrate layer 502. In embodiments, the P-type epitaxial layers 506a may be directly on the P-type regions 502a. In embodiments, TCN 510a may be directly coupled with the P-type epitaxial layers 506a. As a result, an electrical pathway 560 may be formed between one or more TCN 510a. In embodiments, the electrical pathway 560 may be referred to as a P-tap. In embodiments, the electrical pathway 560 provides the ground for the TCN 510a to be used during a VC scan.

In embodiments, nano-ribbons 508, which may be similar to nano-ribbons 108 of transistor structure 100b of FIG. 1B, may extend through the P-type epitaxial regions 506a. In embodiments, gates 520, which may be similar to gates 120 of FIG. 1B, may be positioned between some of the epitaxial layers 510a, 510b. In embodiments, N-type epitaxial layers 506b may be coupled with N-type regions 502b, with TCNs 510b electrically coupled with at least some of the N-type epitaxial layers 506b. In embodiments, nano-ribbons 508 may extend through the N-type epitaxial layers 506b.

FIG. 6 shows a top-down of an array of transistor structures that include P-type epitaxial structures on a P-type substrate, and a VC scan of a part of the transistor structures that show electrically shorted TCNs, in accordance with various embodiments. Transistor structure 600a, which may be similar to transistor structure 500 of FIG. 5, shows a top-down view that includes a ribbon of a P-type substrate 602a, which may be similar to P-type substrate 502a of FIG. 5. TCN 610a, which may be similar to TCN 510a of FIG. 5, may be on P-type epitaxial layers (not shown) that are similar to P-type epitaxial layers 506a of FIG. 5. In embodiments, gates 608, which may be similar to gates 500 of FIG. 5, may be between the TCN 610a.

Image 600b shows a VC scan image where the TCN structures 670 that are electrically coupled through the P-type epitaxial layers 602a appear bright, indicating no defects.

FIG. 7 illustrates an example process for manufacturing a voltage contrast structure, in accordance with various embodiments. In embodiments, the process 700 may be performed using the techniques, processes, apparatus, and/or systems described herein, and in particular with respect to FIGS. 1A-6.

At block 702, the process may include providing a substrate. In embodiments, the substrate may be similar to substrate 102 of FIGS. 1A-1B, or substrate 302 of FIGS. 3A-3B.

At block 704, the process may further include providing a first epitaxial layer on the substrate. In embodiments, a first epitaxial layer may be similar to one of epitaxial layers 106a of FIGS. 1A-1B, or one of epitaxial layers 306 of FIGS. 3A-3B.

At block 706, the process may further include providing a second epitaxial layer on the substrate, wherein one or more nano-ribbons extend through the first epitaxial layer and the second epitaxial layer parallel to a side of the substrate. In embodiments, a second epitaxial layer may be similar to one of epitaxial layers 106a of FIGS. 1A-1B, or one of epitaxial layers 306 of FIGS. 3A-3B. In embodiments, the one or more nano-ribbons may be similar to nano-ribbons 108 of FIGS. 1A-1B, nano-ribbons 208 of FIGS. 2A-2B, nano-ribbons 308 of FIGS. 3A-3B, or nano-ribbons 508 of FIG. 5.

At block 708, the process may further include forming a first trench contact on the first epitaxial layer. In embodiments, the first trench contact may be similar to TCN 110 of FIG. 1A, one of TCN 110 of FIG. 1B, one of TCN 210 of FIGS. 2A-2B, TCN 310 of FIGS. 3A-3B, one of TCN 410 of FIG. 4, or one of TCN 510*a* of FIG. 5.

At block 710, the process may further include forming a second trench contact on the second epitaxial layer. In embodiments, the second trench contact may be similar to TCN 110 of FIG. 1A, one of TCN 110 of FIG. 1B, one of TCN 210 of FIGS. 2A-2B, TCN 310 of FIGS. 3A-3B, one of TCN 410 of FIG. 4, or one of TCN 510*a* of FIG. 5.

At block 712, the process may further include electrically coupling the first trench contact and the second trench contact using an electrical connector, wherein the electrical connector is coupled with a ground. In embodiments, the electrical connector may be similar to electrical connector 112 of FIGS. 1A-1B, electrical connector 212 of FIGS. 2A-2B, electrical connector 312 of FIGS. 3A-3B, or electrical contact 512 of FIG. 5.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
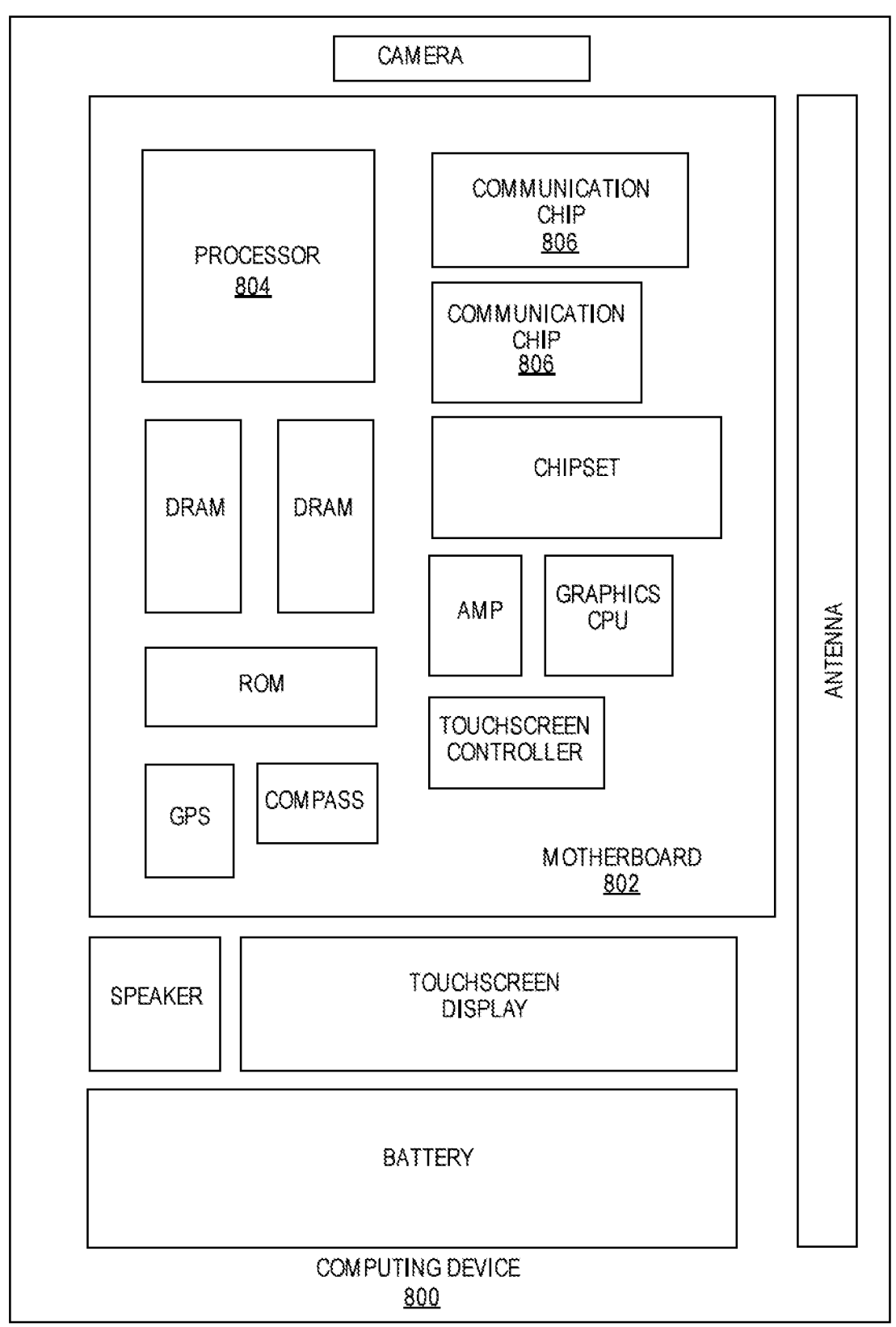
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
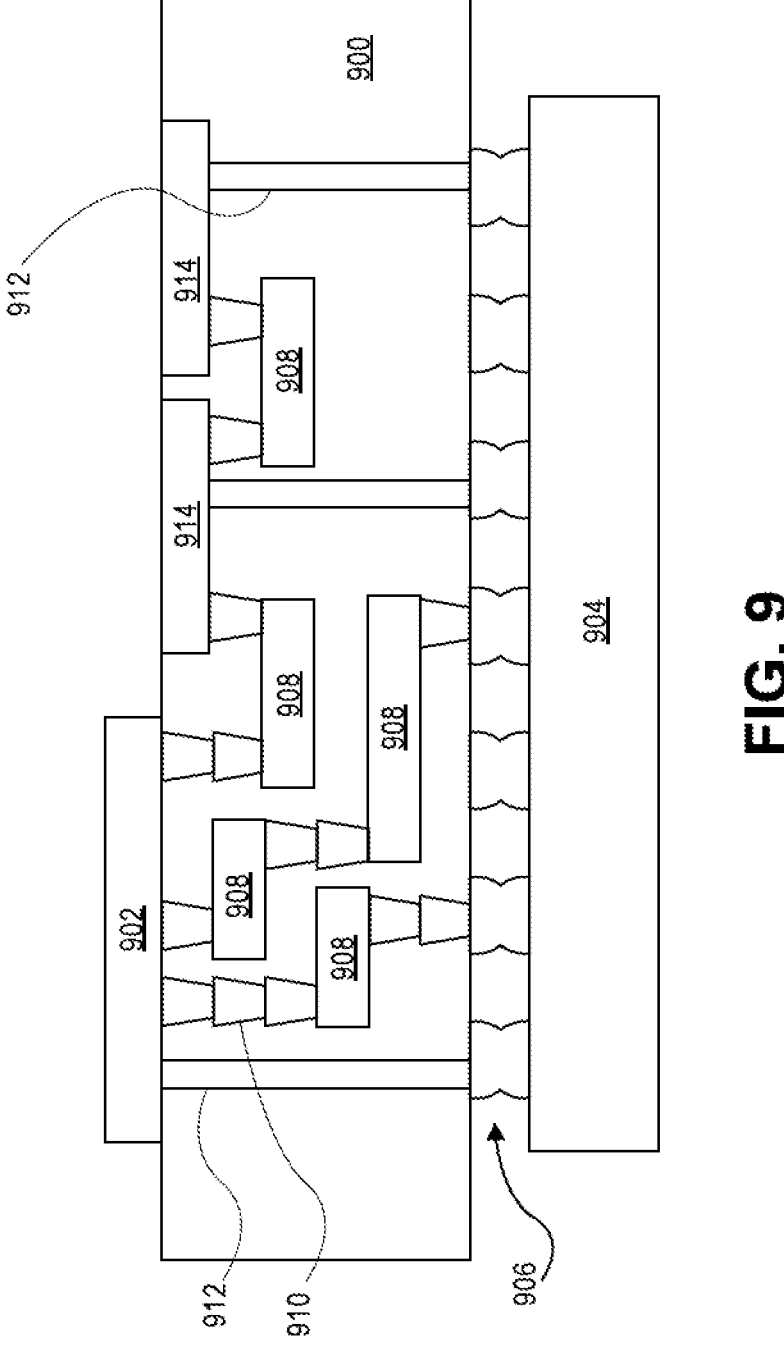
FIG. 9 illustrates an interposer that includes one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a voltage contrast structure comprising: a substrate layer that includes silicon; a nano-ribbon above a side of the substrate, wherein the nano-ribbon is within a first epitaxial layer and within a second epitaxial layer, wherein the first epitaxial layer and the second epitaxial layer are physically coupled with the substrate layer; a first trench connector on the first epitaxial layer; a second trench connector on the second epitaxial layer; and an electrical connector that is electrically coupled with the first trench connector and the second trench connector.

Example 2 includes the voltage contrast structure of example 1, or of any other example or embodiment herein, wherein the nano-ribbon is a plurality of nano-ribbons, and wherein the plurality of nano-ribbons overlap each other in a direction perpendicular to a surface of the substrate layer.

Example 3 includes the voltage contrast structure of example 1, or of any other example or embodiment herein, further comprising a gate around the nano-ribbon, the gate between the first trench connector and the second trench connector.

Example 4 includes the voltage contrast structure of example 1, or of any other example or embodiment herein, wherein the electrical connector is electrically coupled with a ground.

Example 5 includes the voltage contrast structure of example 1, or of any other example or embodiment herein, wherein the electrical connector is electrically coupled with the substrate layer.

Example 6 includes the voltage contrast structure of example 1, or of any other example or embodiment herein, wherein the electrical connector includes electrically conductive metal.

Example 7 includes the voltage contrast structure of example 1, or of any other example or embodiment herein, wherein the second trench connector is a plurality of trench connectors.

Example 8 includes the voltage contrast structure of example 1, or of any other example or embodiment herein, wherein the side of the substrate is a first side, and further including: a second side of the substrate opposite the first side; and a metal layer on the second side of the substrate, wherein the electrical connector is electrically coupled with the metal layer.

Example 9 includes the voltage contrast structure of example 8, or of any other example or embodiment herein, wherein the metal layer on the second side of the substrate is electrically isolated from a power source.

Example 10 includes the voltage contrast structure of example 1, or of any other example or embodiment herein, further comprising an electrical insulator, the electrical insulator between the first epitaxial layer and the silicon substrate or between the second epitaxial layer and the silicon substrate.

Example 11 is a voltage contrast structure comprising: a substrate layer that includes silicon, wherein the substrate layer is a P-type substrate; a nano-ribbon above a side of the substrate, wherein the nano-ribbon is within a first epitaxial layer and within a second epitaxial layer, wherein the first epitaxial layer and the second epitaxial layer are P-type epitaxial layers, and wherein the first epitaxial layer and the second epitaxial layer are physically and electrically coupled with the substrate layer; a first trench connector on the first epitaxial layer; a second trench connector on the second epitaxial layer; and wherein the first trench connector is electrically coupled with the second trench connector through the first epitaxial layer, the substrate layer, and the second epitaxial layer.

Example 12 includes the voltage contrast structure of example 11, or of any other example or embodiment herein, wherein the nano-ribbon is a plurality of nano-ribbons, and wherein the plurality of nano-ribbons overlap each other in a direction perpendicular to a surface of the substrate layer.

Example 13 includes the voltage contrast structure of example 11, or of any other example or embodiment herein, further comprising a gate surrounding the nano-ribbon, wherein the gate is between the first epitaxial layer and the second epitaxial layer.

Example 14 includes the voltage contrast structure of example 13, or of any other example or embodiment herein, wherein the first trench connector or the second trench connector are not directly electrically coupled with the gate.

Example 15 includes the voltage contrast structure of example 11, or of any other example or embodiment herein, wherein the second epitaxial layer is a plurality of epitaxial layers, wherein the second trench connector is a plurality of trench connectors, and wherein the plurality of trench connectors are electrically coupled, respectively, to the plurality of epitaxial layers.

Example 16 includes the voltage contrast structure of example 15, or of any other example or embodiment herein, further comprising a plurality of gates surrounding the nano-ribbon, where at least some of the plurality of gates are between the plurality of trench connectors.

Example 17 includes the voltage contrast structure of example 11, or of any other example or embodiment herein, further comprising an electrical connector that is electrically coupled with the first trench connector and the second trench connector.

Example 18 includes the voltage contrast structure of example 17, or of any other example or embodiment herein, wherein the electrical connector is electrically coupled with the substrate layer.

Example 19 includes the voltage contrast structure of example 17, or of any other example or embodiment herein, wherein the electrical connector includes electrically conductive metal.

Example 20 includes the voltage contrast structure of example 17, or of any other example or embodiment herein, wherein the second trench connector is a plurality of trench connectors.

Example 21 includes the voltage contrast structure of example 17, or of any other example or embodiment herein, wherein the side of the substrate is a first side, and further including: a second side of the substrate opposite the first side; and a metal layer on the second side of the substrate, wherein the electrical connector is electrically coupled with the metal layer.

Example 22 includes the voltage contrast structure of example 21, or of any other example or embodiment herein, wherein the metal layer on the second side of the substrate is electrically isolated from a power rail.

Example 23 is a method comprising: providing a substrate; providing a first epitaxial layer on the substrate; providing a second epitaxial layer on the substrate, wherein one or more nano-ribbons extend through the first epitaxial layer and the second epitaxial layer parallel to a side of the substrate; forming a first trench contact on the first epitaxial layer; forming a second trench contact on the second epitaxial layer; and electrically coupling the first trench contact and the second trench contact using an electrical connector, wherein the electrical connector is coupled with a ground.

Example 24 includes the method of example 23, or of any other example or embodiment herein, wherein the ground is a ground of the substrate.

Example 25 includes the method of example 23, or of any other example or embodiment herein, further comprising: applying an electronic beam to the first trench contact and the second trench contact; and identifying whether the first trench contact and the second trench contact are electrically coupled based upon a brightness of a scan image of the first trench contact and the second trench contact.

What is claimed is:

1. A voltage contrast structure comprising:
a substrate layer that includes silicon;
a nano-ribbon above a side of the substrate, wherein the nano-ribbon is coupled to a first epitaxial layer and coupled to a second epitaxial layer, wherein the first epitaxial layer and the second epitaxial layer are physically coupled with the substrate layer;
a first trench connector on the first epitaxial layer;
a second trench connector on the second epitaxial layer; and
an electrical connector that is electrically coupled with the first trench connector and the second trench connector, the electrical connector having a top surface at a same level as a top surface of the first trench connector and as a top surface of the second trench connector.

2. The voltage contrast structure of claim 1, wherein the nano-ribbon is a plurality of nano-ribbons, and wherein the plurality of nano-ribbons overlap each other in a direction perpendicular to a surface of the substrate layer.

3. The voltage contrast structure of claim 1, further comprising a gate around the nano-ribbon, the gate between the first trench connector and the second trench connector.

4. The voltage contrast structure of claim 1, wherein the electrical connector is electrically coupled with a ground.

5. The voltage contrast structure of claim 1, wherein the electrical connector is electrically coupled with the substrate layer.

6. The voltage contrast structure of claim 1, wherein the electrical connector includes electrically conductive metal.

7. The voltage contrast structure of claim 1, wherein the second trench connector is a plurality of trench connectors.

8. The voltage contrast structure of claim 1, wherein the side of the substrate is a first side, and further including:
a second side of the substrate opposite the first side; and
a metal layer on the second side of the substrate, wherein the electrical connector is electrically coupled with the metal layer.

9. The voltage contrast structure of claim 8, wherein the metal layer on the second side of the substrate is electrically isolated from a power source.

10. The voltage contrast structure of claim 1, further comprising an electrical insulator, the electrical insulator between the first epitaxial layer and the silicon substrate or between the second epitaxial layer and the silicon substrate.

11. A voltage contrast structure comprising:
a substrate layer that includes silicon, wherein the substrate layer is a P-type substrate;
a nano-ribbon above a side of the substrate, wherein the nano-ribbon is coupled to a first epitaxial layer and coupled to a second epitaxial layer, wherein the first epitaxial layer and the second epitaxial layer are P-type epitaxial layers, and wherein the first epitaxial layer and the second epitaxial layer are physically and electrically coupled with the substrate layer;
a first trench connector on the first epitaxial layer;
a second trench connector on the second epitaxial layer; and
wherein the first trench connector is electrically coupled with the second trench connector through the first epitaxial layer, the substrate layer, and the second epitaxial layer; and
an electrical connector that is electrically coupled with the first trench connector and the second trench connector, the electrical connector having a top surface at a same level as a top surface of the first trench connector and as a top surface of the second trench connector.

12. The voltage contrast structure of claim 11, wherein the nano-ribbon is a plurality of nano-ribbons, and wherein the plurality of nano-ribbons overlap each other in a direction perpendicular to a surface of the substrate layer.

13. The voltage contrast structure of claim 11, further comprising a gate surrounding the nano-ribbon, wherein the gate is between the first epitaxial layer and the second epitaxial layer.

14. The voltage contrast structure of claim 13, wherein the first trench connector or the second trench connector are not directly electrically coupled with the gate.

15. The voltage contrast structure of claim 11, wherein the second epitaxial layer is a plurality of epitaxial layers, wherein the second trench connector is a plurality of trench connectors, and wherein the plurality of trench connectors are electrically coupled, respectively, to the plurality of epitaxial layers.

16. The voltage contrast structure of claim 15, further comprising a plurality of gates surrounding the nano-ribbon, where at least some of the plurality of gates are between plurality of trench connectors.

17. The voltage contrast structure of claim 11, wherein the electrical connector is electrically coupled with the substrate layer.

18. The voltage contrast structure of claim 11, wherein the electrical connector includes electrically conductive metal.

19. The voltage contrast structure of claim 11, wherein the second trench connector is a plurality of trench connectors.

20. The voltage contrast structure of claim 11, wherein the side of the substrate is a first side, and further including:
a second side of the substrate opposite the first side; and
a metal layer on the second side of the substrate, wherein the electrical connector is electrically coupled with the metal layer.

21. The voltage contrast structure of claim 20, wherein the metal layer on the second side of the substrate is electrically isolated from a power rail.

22. A method comprising:
providing a substrate;
providing a first epitaxial layer on the substrate;
providing a second epitaxial layer on the substrate, wherein one or more nano-ribbons extend through the first epitaxial layer and the second epitaxial layer parallel to a side of the substrate;

forming a first trench contact on the first epitaxial layer;

forming a second trench contact on the second epitaxial layer; and electrically coupling the first trench contact and the second trench contact using an electrical connector, the electrical connector having a top surface at a same level as a top surface of the first trench contact and as a top surface of the second trench contact, wherein the electrical connector is coupled with a ground.

23. The method of claim 22, wherein the ground is a ground of the substrate.

24. The method of claim 22, further comprising:

applying an electronic beam to the first trench contact and the second trench contact; and identifying whether the first trench contact and the second trench contact are electrically coupled based upon a brightness of a scan image of the first trench contact and the second trench contact.

\* \* \* \* \*